United States Patent [19]

Wirz

[11] Patent Number: 4,978,437
[45] Date of Patent: Dec. 18, 1990

[54] METHOD OF APPLYING OPTICAL COATINGS OF SILICON COMPOUNDS BY CATHODE SPUTTERING, AND A SPUTTERING CATHODE FOR THE PRACTICE OF THE METHOD

[75] Inventor: Peter Wirz, Waldernbach, Fed. Rep. of Germany

[73] Assignee: Leybold Aktiengesellschaft, Hanau I, Fed. Rep. of Germany

[21] Appl. No.: 9,075

[22] Filed: Jan. 27, 1987

Related U.S. Application Data

[63] Continuation of Ser. No. 729,294, May 1, 1985, abandoned.

[30] Foreign Application Priority Data

May 12, 1984 [DE] Fed. Rep. of Germany ....... 3417732

[51] Int. Cl.$^5$ .............................................. C23C 14/34
[52] U.S. Cl. .......................... 204/192.23; 204/192.15; 204/192.26; 204/298.13
[58] Field of Search ........... 204/192.1, 192.12, 192.15, 204/192.18, 192.22, 192.23, 192.26, 192.27, 291

[56] References Cited

U.S. PATENT DOCUMENTS

| | | | |
|---|---|---|---|
| 4,251,289 | 2/1981 | Moustakas et al. | 204/192 S X |
| 4,365,015 | 12/1982 | Kitajima et al. | 204/192 P X |
| 4,374,391 | 2/1983 | Camlibel et al. | 204/192 D X |
| 4,380,557 | 4/1983 | Ishioka et al. | 204/192 P X |
| 4,430,185 | 2/1984 | Shimomoto et al. | 204/192 P |
| 4,508,609 | 4/1985 | Moustakas et al. | 204/192 S |

FOREIGN PATENT DOCUMENTS

| | | | |
|---|---|---|---|
| 2461763 | 3/1981 | France | 204/192 S |
| 0109325 | 7/1982 | Japan | 204/192 S |

OTHER PUBLICATIONS

Suzuki et al., "Doping Effects of Group III and V Element on a —Si Prepared by High Pressure rf Sputtering", Japanese Journal of Applied Physics, vol. 19 (1980), Supplement 19-2, pp. 85-89.
Thorton et al., "Internal Stresses in Amorphous Silicon Films Deposited by Cylindrical Mag. Sputtering Using Me, Ar, Kr, Xe and Ar+H$_2$", J. Vac. Science Technol., 18(2), 3/81, pp. 203-207.

Primary Examiner—Nam X. Nguyen
Attorney, Agent, or Firm—Felfe & Lynch

[57] ABSTRACT

Method of applying optical coatings of silicon compounds to substrates by reactive cathode sputtering of siliceous target materials. To solve the problem of improving the utilization of the target material and eliminating the blowout of particles from the target, the target of the invention is a polycrystalline silicon casting of at least 99% silicon containing dopants from the group, boron, antimony, phosphorus and arseic, and it is sputtered by direct current in an atomsphere containing the reaction gas.

2 Claims, 1 Drawing Sheet

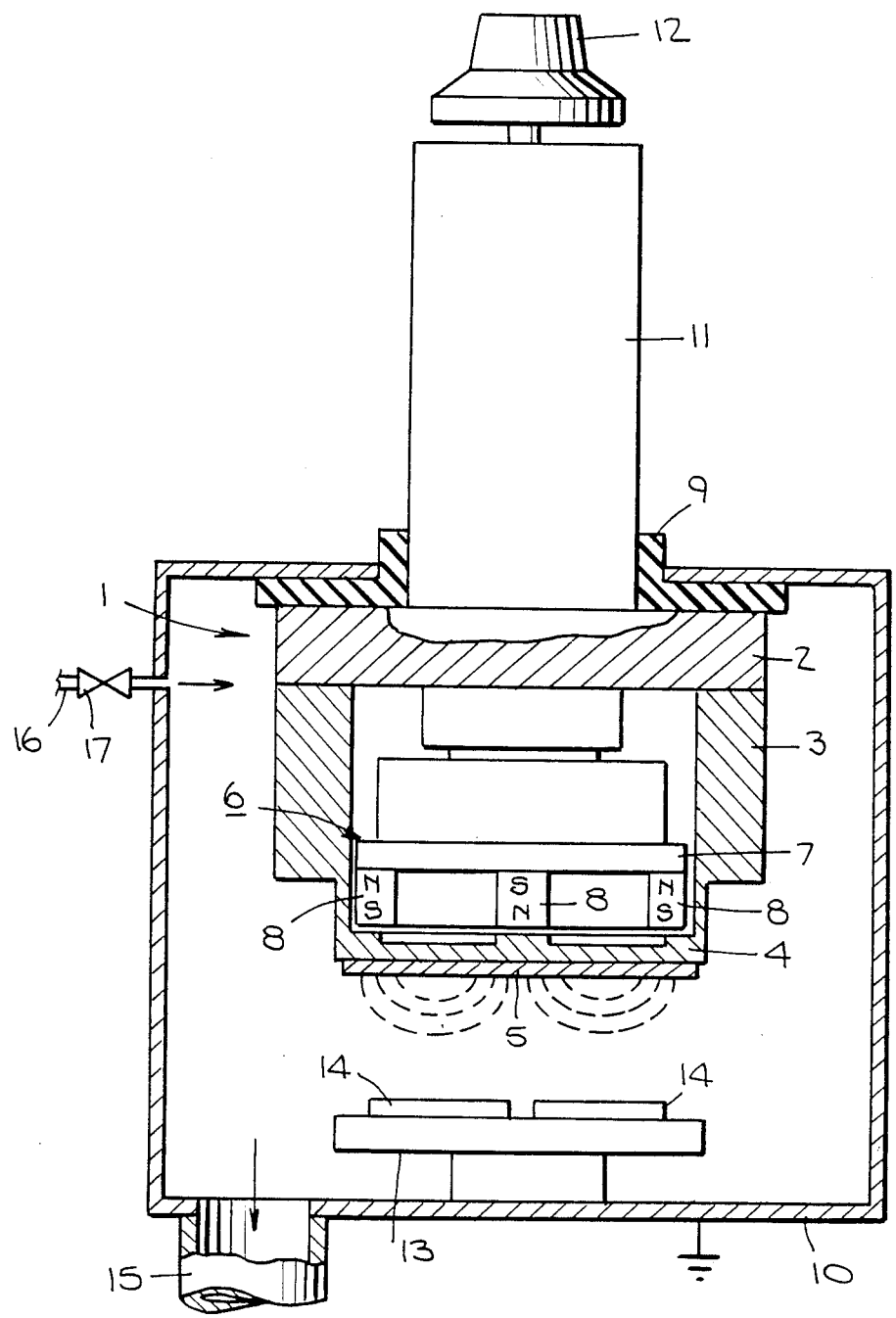

METHOD OF APPLYING OPTICAL COATINGS OF SILICON COMPOUNDS BY CATHODE SPUTTERING, AND A SPUTTERING CATHODE FOR THE PRACTICE OF THE METHOD

This application is a continuation, of application Ser. No. 729,294, filed May 1, 1985.

BACKGROUND OF THE INVENTION

The invention relates to a method of applying optical coatings of silicon compounds to substrates by reactive cathode sputtering of siliceous target materials.

It is known to use, for the production of coatings of silicon compounds, a planar target material which has been formed under high pressure from silicon powder containing additional materials such as aluminum and lithium to produce electrical conductivity and improve thermal conductivity. For the achievement of a high density of the target material, the compression is performed at high temperatures on the order of 2000° C. Due to this complex manufacturing process such targets are very expensive. For example, a target plate measuring 70 cm×25 cm×1 cm costs between DM 25,000.00 and DM 40,000.00. At the same time, hot-pressed target material has the disadvantage that, due to its still-grainy or porous texture, it has a large surface area, and this necessitates a relative long period of time for the process of cleaning the target material for each new batch. This means a preliminary sputtering of the target surface onto a plate or diaphragm temporarily inserted between the target and substrate. The correspondingly long time required for the cleaning process results in a corresponding loss of material, but also makes the sputtering apparatus less economical to operate, since the actual coating process does not begin until the cleaning process is completed.

Moreover, the surface of a pressed material is rough, from the microscopic viewpoint, and as the sputtering process advances so-called bumps or humps can form on the surface. This is to be attributed basically to the different rates of sputtering of the components contained in the target material, such as aluminum and lithium, for example. On account of the low thermal conductivity between the humps and the rest of the material a local overheating occurs which causes solid particles of the target material to burst out of the target plate. Even if these particles do not come in contact with the substrates, however, this process has a negative effect on the growth and homogeneity of the layer deposited on the substrate.

Reactive cathode sputtering is chiefly a process of oxidation that occurs while the coating is in progress, i.e., oxygen is contained in the reaction gas, and oxides of silicon, mostly silicon dioxide, are formed. Similar considerations apply, of course, to other reaction gases, nitrogen for example, if silicon nitride is to be formed on the substrates.

The above-described reactive processes are not free, either, of adverse effects on the target materials. In the case of hot-pressed target materials, there is especially the tendency to form on the sputtering surface layers of the product of the reaction with the reaction gas, that is, layers of silicon dioxide in the case of oxygen. Such reaction products are electrical nonconductors, so that the sputtering process is at least locally hampered, or in any case is impeded unless a high frequency is used for the sputtering process. On account of the greater simplicity of the technique, however, there is a tendency to use so-called diode sputtering insofar as possible, along with a magnetic field enhancement of the sputtering process in some cases, in order to raise the otherwise low sputtering rate by at least one power of ten. The classical hot-pressed target material, however, leads to the problems stated above.

The article by Thornton and Hoffmann, "Internal Stresses in Amorphous Silicon Films Deposited by Cylindrical Magnetron Sputtering using Ne, Ar, Kr, Xe and Ar +H$_2$", which appeared in J. Vac. Sci. Technol., 18 (2), Mar. 1981, pages 203 to 207, discloses the use of polycrystalline silicon, drawn in rod form from fusion, as a cathode in a sputtering process wherein the cathode is provided with doping to achieve the necessary electrical conductivity, and the doping material has to be diffused into the cathode material by an exceedingly tedious process. The described cathode sputtering process is not part of a production process, but serves only for the study of internal tensions in the coatings thus produced. The production of the rod-shaped cathode calls for the insertion of a narrow slit diaphragm, so that a very large part of the material sputtered away from the cathode is deposited on the diaphragm, not on the substrate. In any event, this state of the art has to do with the production of coatings having special electrical properties, not coatings for optical applications.

The article by Severin, entitled, "Materialien fuer die Kathoden-Zerstaeubung," which appeared in *Vakuum-Technik*, vol. 33, No. 1, pp. 3 to 9, discloses the production of cast targets made from an aluminum-silicon alloy. The aluminum content, however, is very high, since the aluminum is intended to produce not only a good electrical conductivity permitting sputtering by direct current, but also to permit plastic mechanical deformation for the purpose of subsequent "grain fining." With such targets, however, homogeneous coatings of virtually pure silicon dioxide cannot be produced, since at least aluminum oxide is an important component of the coatings, and silicon and aluminum behave differently in the sputtering, so that the relative proportions of the oxides change as the consumption of the target progresses.

Optical coatings of silicon compounds, especially those of silicon dioxide, however, are playing a vital role ino today's coating technology, both as a final protective coating on large-area substrates such as windowpanes, for example, and as a material for multiple coatings built us of alternating high and low refraction layers (known as "interference filters").

It is therefore the object of the invention to device a method of the kind described above, in which the utilization of the target material, consisting of at least 99% silicon, will be improved and the danger of particles bursting out of the target material will be eliminated or at least greatly reduced.

BRIEF DESCRIPTION OF THE DRAWINGS

The single FIGURE is a diagrammatic view of the apparatus partly in section for practicing of the method of the invention.

THE INVENTION

In the method described above, this object is achieved in accordance with the invention in that a polycrystalline silicon casting, solidified from fusion and composed of at least 99% silicon plus dopants from the group, boron, antimony, phosphorus and arsenic, is sputtered by direct current in an atmosphere containing the reaction gas.

In the method of the invention, therefore, the casting, which is as a rule a plate defined by plane-parallel surfaces, is produced from molten material by a casting process in which polycrystalline silicon is formed. This is virtually pure silicon, which contains only dopants in the parts-per-million range, and is not mechanically deformable. In a casting process of this kind, the dopants can be distributed uniformly in the melt by simple admixture, so that a time-consuming diffusion process is unnecesary. The dopants serve only to produce sufficient conductivity during the sputtering process, not for the production of a defined conductivity in the deposited coatings, which in any case is only an accompanying phenomenon of secondary importance.

If the target is of parallelepipedal shape, it can easily be fastened on a cathode base which as a rule is intensively cooled by a water circuit. Thus the target plate, too, can be intensively cooled. Other advantages of plate-like targets are low losses of material and high efficiency in the coating of planar substrates.

In the sputtering process, it is found, first of all, that even on the microscopic scale, a smooth surface is preserved on the target, which is far less inclined to oxidize than sintered or pressed and thus porous target plates. Such a plate also has adequate and, above all, uniform thermal conducting properties, so that local overheating no longer possible. Consequently, the electrical power per unit of area of the target material can be considerably increased, thus also increasing the sputtering range. And yet no blowout of surface particles from the target has been observed. Since the sputtering process is thus more uniform, greater homogeneity has been maintained within the coatings produced. The costs of a target plate in accordance with the invention, having the dimensions given above, are only a fraction of the cost of a corresponding hot-pressed target plate.

Above all, however, the deposited coatings contain virtually no more dopants, since they have been reduced in the sputtering process by pumping down or evacuation, and cannot reach the substrates. For this reason the indices of refraction of the produced coatings are identical to those which are produced by the reactive, high-frequency sputtering of undoped material.

The invention also relates to a sputtering cathode for the practice of the process of the invention in conjunction with a so-called magnetron cathode, in which the plasma discharge is defined by a closed tunnel of magnetic lines of force to a narrow space in the immediate vicinity of the target surface.

Such a target consists, for the solving of the same problem, of a polycrystalline silicon casting solidified from the molten state and composed of at least 99% silicon with dopants from the group, boron, antimony, phosphorus and arsenic.

DESCRIPTION OF A PREFERRED EMBODIMENT

An embodiment of an apparatus for the practice of the method of the invention will now be explained in conjunction with the drawing, which is a vertical cross section taken through a complete apparatus.

In the drawing there can be seen a cathode system 1 with a supporting plate 2 which is fastened through an insulator 9 to the roof of a vacuum chamber 10. All of the parts of the cathode system which are essential to its operation are fastened also to the supporting plate 2. This includes a trough-like hollow body 3 which consists of a nonmagnetic material such as copper, for example, and is removably attached to the supporting plate 2. The hollow body 3 has a bottom 4 which is parallel to the supporting plate, and on which is mounted a consumable target plate 5 of the silicon cast in accordance with the invention. This hollow body can be attached in a conventional manner, e.g., by soldering.

Inside of the hollow body 3 there is a magnet system 6 which consists of a magnet holding plate 7 parallel with the supporting plate 2, and a group of permanent magnets 8 which are fastened to the magnet holding plate 7. The magnets 8 are arrayed on the back of the target plate 5 with alternating polarity. Due to the polarity and to the relative position of the magnets with respect to the target plate, the lines of force assume the pattern indicated by broken lines, i.e., the lines of force emerging from one pole pass through the target plate and, on an arcuate course, re-enter the target plate in the area of the other pole. This pattern of the magnetic lines of force produces a so-called magnetic tunnel, which makes it possible to increase the sputtering rate substantially, but at the same time causes the target material to be ablated more intensely in the area of the tunnel, and most intensely in the middle of each tunnel.

Between the magnet holding plate 7 on the one hand and the supporting plate 2 on the other there is disposed an adjusting means 11, not explained in detail, which can be operated by an adjusting knob 12, and by which the distance between the magnet system 6 and the target plate can be varied, in order for example to compensate for the effect of the sputtering or erosion pits which become increasingly deep during the sputtering process.

The cathode system 1 is connected to a direct-current voltage source, also not shown, which supplies a suitable sputtering voltage between, say, 200 and 800 volts. Also not shown is the grounded shield which surrounds the side walls of the cathode system 1 and which prevents the formation of glow discharges at these undesired places. Reference is made to German publication OS 30 47 113 for further details which, with the exception of the target material, pertain to the state of the art.

In the vacuum chamber 10, a substrate holder 13 is disposed opposite the target plate 5, and the substrates 14 which are to be coated are mounted thereon. The vacuum chamber 10 is connected by a vacuum line 15, shown in part, to a set of vacuum pumps whereby a vacuum suitable for the sputtering process can be produced, of between $5 \times 10^{-2}$ and $10^{-4}$. The reaction gas needed for the sputtering process is delivered by a conduit 16 provided with a metering valve 17.

EXAMPLE

In an apparatus in accordance with the drawing, substrates of optical glass measuring 20 cm × 20 cm × 0.5 cm are arranged on the substrate holder 13. The distance between the top of the substrates and the face of the target plate was 20 cm. The target plate was composed of "tiles" of a size of 10 cm × 10 cm and had surface dimensions of 80 cm × 20 cm and a thickness of 10 mm. The target material was silicon doped with boron and having a specific resistance of about 3 ohms centimeter, prepared by polycrystalline solidification from the molten state in a mold.

After the customary preliminary evacuation, the surface of the target plate was cleaned for 5 minutes against a plate inserted over the substrates 14. At the end of the cleaning process, a pressure of $10^{-2}$ mbar was established by the continuous admission of a mixture of argon and oxygen in a ratio of 10:1. In the sputtering process then performed for a period of 3 minutes, a coating of silicon dioxide 420 nm thick was deposited on the substrates. At a sputtering voltage of 585 volts and a current to the ground of 35 amperes, a specific sputtering power of 12.8 W/cm$^2$ is computed with respect to the free surface area of the target plate 5. The specific sputtering power can be considered to be relatively very high (in comparison to about 6 W/cm$^2$ in the case of a hot-pressed target plate).

Nevertheless, no blowout of particles from the target plate could be observed. The coating thickness deviations amounted to less than 3%.

The percentages stated with respect to the silicon content of the target are percentages by weight.

I claim:

1. Method for applying optical coatings of compounds of silicon to substrates by reactive cathode sputtering of siliceous target materials, comprising: sputtering as the target material a cast and solidified-from-the-molten-state polycrystalline silicon formed body of at least 99% silicon with at least one dopant selected from the group consisting of boron, antimony, phosphorus and arsenic, said silicon formed body containing said at least one dopant only in the range such that said silicon formed body has a specific resistance of 0.5 to 10 ohms $\times$ centimeter by direct current in an atmosphere containing the reaction gas.

2. Sputtering cathode as a target for applying an optical coating to a substrate comprising: a formed body of siliceous material as a target for applying an optical coating to a substrate, the target comprising a cast and solidified-from-the-molten-state polycrystalline silicon formed body of at least 99% silicon with at least one dopant selected from the group consisting of boron, antimony, phosphorus and arsenic, said silicon formed body containing said at least one dopant only in the range such that said silicon formed body has a specific resistance of 0.5 to 10 ohms $\times$ centimeter.

* * * * *